United States Patent [19]
Beasom

[11] Patent Number: 5,929,503
[45] Date of Patent: Jul. 27, 1999

[54] PUNCH-THROUGH DIODES AND APPLICATIONS

[75] Inventor: James D. Beasom, Melbourne Village, Fla.

[73] Assignee: Harris Corporation, Melbourne, Fla.

[21] Appl. No.: 08/868,815

[22] Filed: Jun. 4, 1997

Related U.S. Application Data

[63] Continuation of application No. 08/344,123, Nov. 23, 1994, abandoned, which is a continuation of application No. 07/821,069, Jan. 16, 1992, abandoned.

[51] Int. Cl.$^6$ .................................................. H01L 29/861
[52] U.S. Cl. .......................... 257/497; 327/52; 327/56; 327/320; 327/333; 327/562; 327/563; 257/272; 257/273; 257/280; 257/551; 257/566
[58] Field of Search .................................. 257/497, 272, 257/273, 280, 551, 566; 327/52, 56, 320, 333, 562, 563

[56] References Cited

U.S. PATENT DOCUMENTS

| | | |
|---|---|---|
| 3,488,527 | 1/1970 | Ruegg . |
| 3,566,213 | 2/1971 | Kaiser . |
| 3,571,630 | 3/1971 | Widlar ..................................... 327/580 |
| 3,758,831 | 9/1973 | Clark . |
| 4,398,142 | 8/1983 | Beasom . |
| 4,405,932 | 9/1983 | Ishii et al. . |
| 4,456,918 | 6/1984 | Beasom . |
| 4,495,694 | 1/1985 | Beasom . |
| 4,683,483 | 7/1987 | Burnham et al. . |
| 4,689,651 | 8/1987 | Hanna et al. . |
| 4,734,752 | 3/1988 | Liu et al. . |
| 4,948,745 | 8/1990 | Beasom . |

FOREIGN PATENT DOCUMENTS 56-118371  9/1981  Japan .

OTHER PUBLICATIONS

A Fast, Accurate Comparator, Electronic Design, Sep. 13, 1980, p. 86.

Session VI: Circuit Techniques I, THAM 6.5: A New Low-Voltage Breakdown Diode, by R.J. Widlar, 1968 International Solid–State Circuits Conference p. 66–67 dated Feb. 15, 1968.

Ahmad et al. Electronics Letters, May 13, 1976, 233–234, vol. 12, No. 10, "Schottky Baritt".

*Primary Examiner*—John Guay
*Attorney, Agent, or Firm*—Barnes & Thornburg

[57] ABSTRACT

A punch-through diode includes a first and second gate forming first and second junctions respectively with and spaced from each other by a first region. The junctions may be PN junction or Schottky barrier junctions with the first region. The diode may be the top gate-channel-bottom gate junctions of an FET or the collector-base-emitter junctions of a bipolar transistor. In either case, the channel or the base is depleted and currents flow between the top and bottom gate or the emitter and collector respectively. The punch-through diode is used as a voltage reference element and can be structured for Kelvin connection.

15 Claims, 6 Drawing Sheets

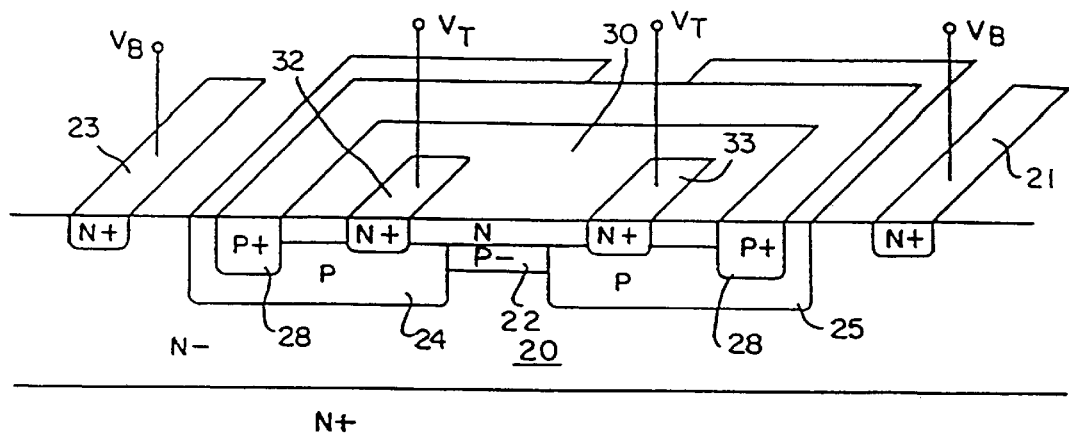
FIG. 8
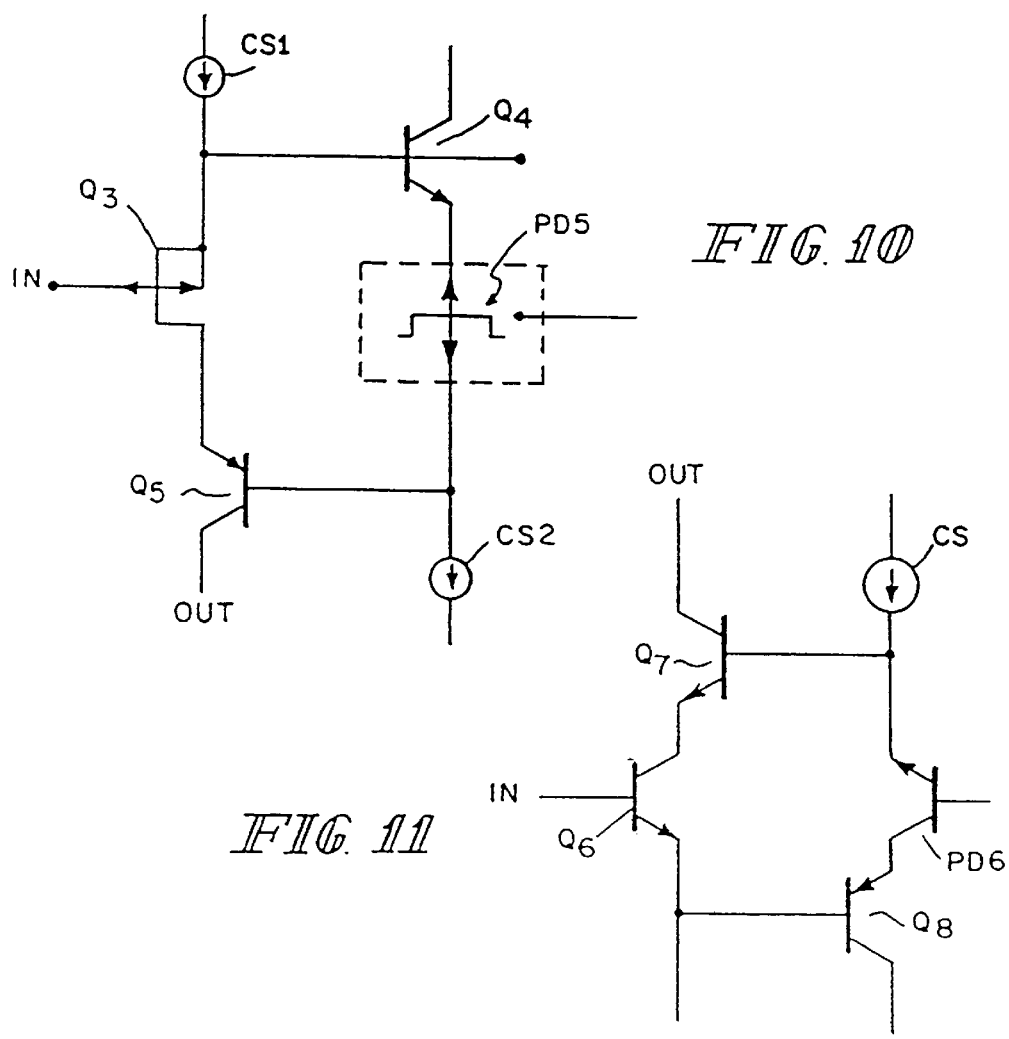
FIG. 10
FIG. 11

PUNCH-THROUGH DIODES AND APPLICATIONS

This is a Continuation of application Ser. No. 08/344,123, having a filing date of Nov. 23, 1994 which is a continuation of 07/821,069, filed Jan. 16, 1992, which is now abandoned.

BACKGROUND AND SUMMARY OF THE INVENTION

The present invention relates generally to voltage references and more specifically to punch-through diodes.

Many analog circuits have differential inputs wherein the inputs are the bases of two bipolar devices forming the differential pair. These inputs are subject to large differential voltages under some conditions. When the differential voltage at the input exceeds the blocking voltage between the base terminals ($BV_{EBO}+V_{BE}$, for a simple common emitter differential pair), the emitter-base junction of one member of the input pair breaks down. Such breakdown can damage the device, resulting in reduced HFE (especially at low current), degrade the $V_{BE}$ match and increase noise. A number of circuits of the prior art use diodes with breakdowns lower than $BV_{EBO}$ connected between the bases of the input transistors, to protect the input devices from this problem.

A typical prior art circuit is illustrated in FIG. 1 as including input transistors Q1 and Q2 receiving input voltages V1 and V2 at their bases and having their emitters connected in common with a current source CS. A pair of zener diodes Z1 and Z2 are connected in opposition across the inputs or bases of the differential input pair. The zener diodes generally have a breakdown voltage of 5 volts where the $BV_{EBO}$ of the bipolar transistors is generally above 6 volts. For appropriate voltage differential, one of the zener diodes breaks down creating a current path between the inputs V1 and V2 to protect the input devices Q1 and Q2.

One of the problems with the zener diode scheme of FIG. 1 is that the protection diode Z1, Z2 is forward biased during protection. This forward biasing develops a large stored charge of excess carriers. When the input returns to a normal range from the large differential voltage which broke down the protection zener diode Z1, Z2, a stored charge is still present and disrupts proper action of the differential pair until it has been removed or recombined. Thus while providing protection for the input pair Q1, Q2, diodes Z1, Z2 disrupt the normal operation of the circuit. Thus there is a need for a voltage protection device which does not store excess charge when it operates as a protecting device.

Thus it is an object of the present invention to provide a voltage referenced device which does not store charge when it acts as a protecting device.

Another object of the present device is to provide a punch-through diode structure which minimizes charge storage.

These and other objects of the invention are achieved by providing a punch-through diode as a voltage reference in a circuit as well as an improved punch-through diode. The punch-through diode uses majority carriers for conduction so that it minimizes charge storage. A punch-through diode includes a first and second gate forming first and second junctions respectively with a first region and the gates are spaced from each other by a first portion of the first region. The diode conducts current between the first and second gates when the voltage difference between the first and second gates depletes the first portion of the first region between the first and second gates. This is the punch-through majority carrier operation. A first gate may be a second region of a first conductivity type forming a PN junction with a first region of a second conductivity type or may be a gate material which forms a Schottky barrier junction with the first region. The second gate is a third region of the first conductivity type forming a PN junction with the first region.

The punch-through diode may have an FET structure wherein the first junction is the top gate-channel junction of the FET structure and the second junction is the bottom gate-channel junction of the FET structure. Alternatively, the diode may have a bipolar transistor structure wherein the first junction is the emitter-base junction of the bipolar structure and the second junction is the collector-base junction of the bipolar structure. In either case, it is the channel or the base which is depleted which causes flow between the top and bottom gate or the emitter and collector respectively. The first portion of the first region has a lower impurity concentration and a smaller thickness than the remainder of the first region. Wherein the first gate is a second region of a conductivity type opposite the conductivity type of the first region, it also has a first portion extending over the first portion of the first region and into the remainder of the first region. The first region of the first gate also has a second portion in the remainder of the first region of a greater thickness than the first portion of the second region.

When either of the gates has a low series resistance, and the other has a high series resistance the other gate may have two separate contacts for a Kelvin connection of the diode to reduce the effect of series on resistance performance. Wherein both of the gates have high series resistance, one or both may have two separate contacts for Kelvin connections of the diode. The Kelvin connection in combination with an operational amplifier provides a voltage references.

For the use of the punch-through diode in a differential amplifier, a first punch-through diode is connected between the first and second inputs for conducting current from the first input to the second input when the voltage at the first input exceeds the voltage at the second input beyond the normal operating voltage range of the amplifier. A second punch-through diode is connected between the first and second inputs for conducting current from the second input to the first input when the voltage at the second input exceeds the voltage at the first input beyond the normal operating voltage range of the amplifier. These diodes are connected in anti-parallel configuration as compared to the series configuration of FIG. 1 of the prior art.

The unique punch-through structure may be also used in a clamp or cascoded transistor circuit. A punch-through diode is in a circuit connected to the two current path terminals of a first transistor to be clamped for establishing an operating voltage across the first transistor which is substantially independent of the voltage on a control terminals of the first transistor relative to the supply voltage of the circuit. The punch-through diode has the same structure as the first transistor. Wherein the first transistor is an FET, the punch-through diode would have an FET structure wherein the first and second terminals of the diode would represent the top and bottom gates of the first field effect transistor forming junctions with and separated by the channel which is the punch-through region. Wherein the first transistor is a bipolar transistor, the punch-through diode would have the structure of the bipolar transistor with its first and second terminal represented by the collector and emitter and forming junctions respectively with and separated by the base which is the punch-through region.

In a cascode configuration, a second transistor has its current path connected in a series with the current path of the first transistor and a third transistor is connected in a series with the punch-through diode. A control terminal of the third transistor is connected to the first transistor's current path and the control terminal of second transistor is connected to the second terminal of the punch-through diode. The second and third transistors are of opposite conductivity types.

The top gate, bottom gate and channel structure as well as the collector, base and emitter structure are those produced in the standard process of creating field effect transistors and bipolar transistors. Thus the punch-through diodes having FET and bipolar structures may be produced simultaneously with the FET and bipolars in an integrated circuit. This allows maximum tracking for FETS as well as reduction of the process steps to produce the additional structure for both FETS and bipolars.

Other objects, advantages and novel features of the present invention will become apparent from the following detailed description of the invention when considered in conjunction with the accompanying drawings.

BRIEF DESCRIPTION OF THE DRAWINGS

FIG. 8 is a cut-away perspective illustrating a punch-through diode according to the principles of the present invention;

FIG. 10 is a schematic of a clamp field effect transistor using a punch-through diode according to the principles of the present invention;

FIG. 11 is a clamp bipolar transistor including a punch-through diode according to the principles of the present invention.

BEST MODES OF THE INVENTION

Figure 1:
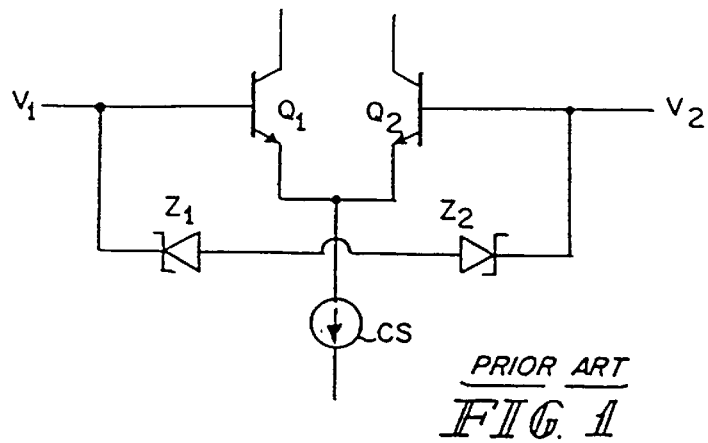
FIG. 1 is a schematic of a differential amplifier according to the prior art.
Figure 2:
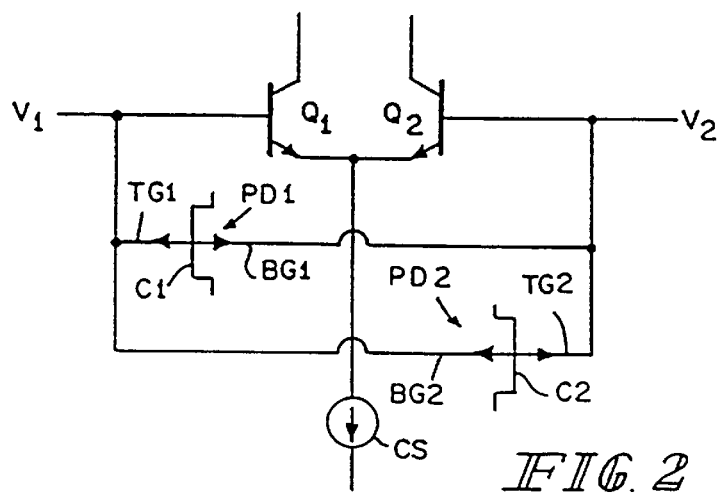
FIG. 2 is a schematic of a differential amplifier input stage incorporating field effect transistor punch-through diodes according to the principles of the present invention.
Figure 3:
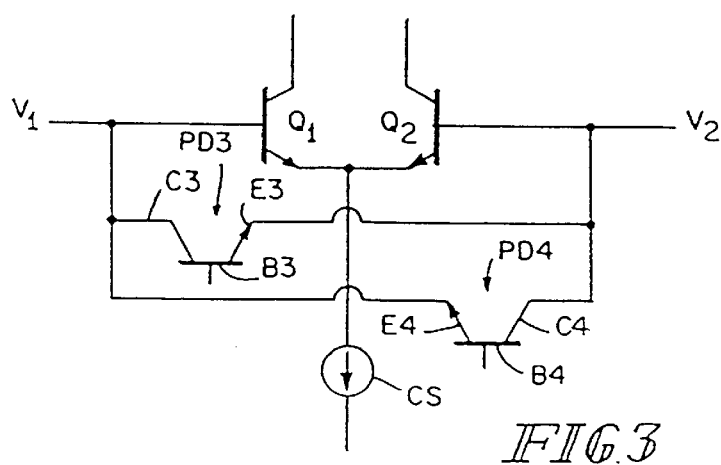
FIG. 3 is a schematic of the input stage of a differential amplifier having bipolar-punch-through diodes according to the principles of the present invention.

As illustrated in FIGS. 2 and 3, the input devices of a differential amplifier are protected by an anti-parallel pair of punch-through diodes which use majority carrier conduction which minimizes change storage. In FIG. 2, a punch-through diode PD1 is connected between the inputs V1 and V2 and is illustrated as a field effect transistor having its top gate TG1 connected to V1 and its bottom gate BG1 connected to V2 and separated from each other by the channel region C1. The source and drains are shown as open. When the voltage at V1 is greater than V2 by a first value, the channel region that separates the top gate TG1 and the bottom BD1 is depleted and the diode breaks down and conducts current from V1 to V2. A second punch-through diode PD2 is also connected between V1 and V2 and has its top gate TG2 connected to V2 and its bottom gate BG2 connected to V1. When the voltage at V2 is greater than V1, the channel region C2 between the top gate TG2 and the bottom gate BG2 is depleted, breaks down and conducts current from the input V2 to V1. The breakdown voltages of TD1 and TD2 is less than $BV_{EBO}$ of transistors Q1, Q2.

This mode of operation is to be distinguished from the normal mode of operating a junction field effect transistor which has current flow between the source and drain modulated by the gate biassing.

The impurity concentrations of the top and bottom gate and the channel of the punch-through diodes PD1 and PD2 are such that they are directional devices. A breakdown voltage of the top gate to the bottom gate may be in the range of 2 volts whereas the punch-through of the bottom gate to the top gate is in the range of 20 volts.

A second embodiment of punch-through diodes is shown as bipolar punch-through diodes in FIG. 3. The first punch-through diode PD3 has its collector C3 connected to V1 and its emitter E3 connected to V2. The second punch-through diode PD4 has its collector C4 connected to V2 and its emitter E4 connected to V1. The bases B3 and B4 are left open. The collectors and emitters form first and second gates separated by a punch-through region which is the base. When the voltage on V1 is greater than V2 by the breakdown voltage of PD4, the base B4 depletes and PD4 breaks down and conducts current from V1 to V2. Similarly, when the voltage on V2 is greater than the voltage on V1 by the breakdown voltage of PD3, the base B3 depleting breaks down and conducts current for V2 and V1.

The punch-through diodes of FIGS. 2 and 3 each have a first junction which is reverse biased with respect to the second junction to cause a depletion of the separating region to cause a breakdown and conduction of current. Thus for the P channel FET of PD1 and PD2, the top gate TG is positive with respect to the bottom gate BG.

Figure 4:
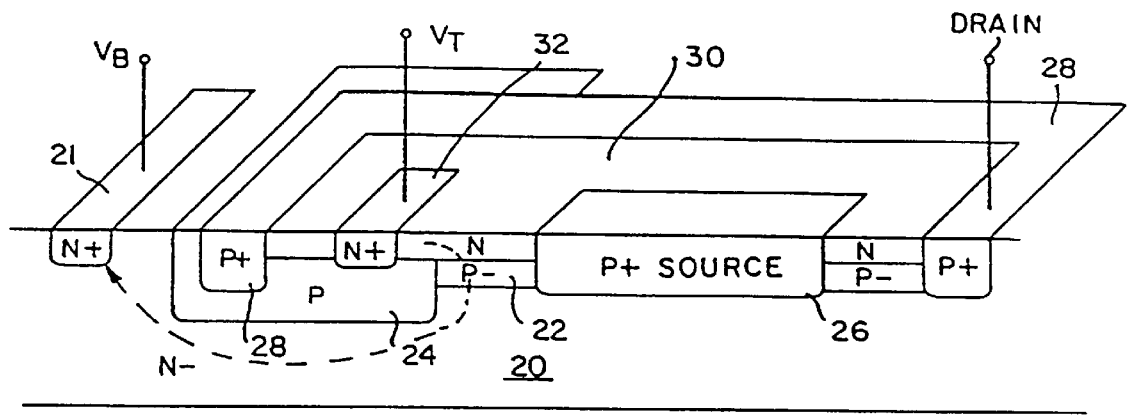
FIG. 4 is a cut-away perspective of a field effect transistor connected to operate as a punch-through diode according to the principles of the present invention.

A P channel junction field effect transistor which is capable of operating as a punch-through diode of FIG. 2 is illustrated in FIG. 4. An N bottom gate 20 has a bottom contact 21. A thin channel region 22 extends between P drain 24 and P+ source 26. P+ drain contact 28 extends around and isolates the N top gate 30 which includes an N+ top gate contact 32. This device is explained in detail in U.S. Pat. Nos. 4,456,918 and 4,495,694. To operate as a punch-through diode, the top gate 32 is considered a positive terminal connected to VT and the bottom gate contact region 21 is the negative terminal connected to VB so the voltage at top gate 32 is greater than the voltage at bottom gate contact region 21. As the applied voltages to the top and bottom gate increases, depletion layer spreads from the top gate 32, 30 into the P channel region 22. When the depletion layer extends all the way across the P channel region 22 and reaches the N bottom gate portion 20 the conduction begins. The current path is from the N+ top gate contact 32 laterally through the N top gate region 30, then vertically through the depleted P channel region 22, into the N bottom gate region 20, laterally through the N bottom gate region 20 and finally up to the N+ bottom gate contact region 21.

Figure 5:
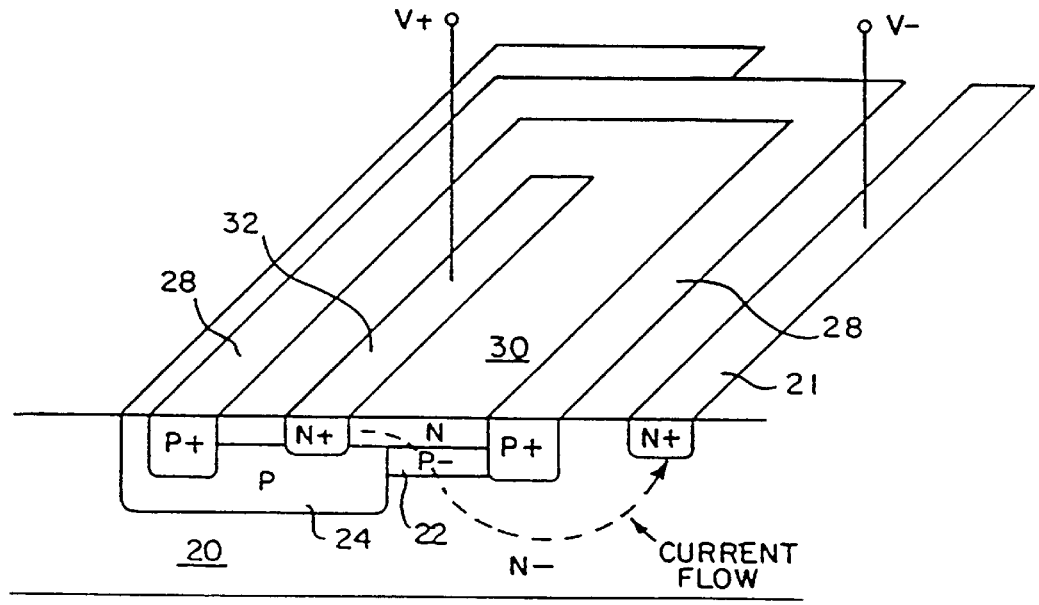
FIG. 5 is a cut-away perspective of a punch-through diode according to the principles of the present invention.

This prior art junction field effect transistor (JFET) structure of FIG. 4 has the appropriate breakdown voltage, but has a significant series resistance in the N top gate region 30 and the N bottom gate region 20. This resistance is further increased by the long narrow path in these regions. A modification of this structure of FIG. 4 to optimize for a punch-through diode application is illustrated in FIG. 5. Those portions having the same function and produced by the same processing steps in FIGS. 4 and 5 have a common reference number. In FIG. 5, the P+ source region 26 has been eliminated to save space since it is not needed in that it is unconnected in the punch-through diode configuration. This allows the number of squares of the N top gate 30 to be reduced, thereby reducing its series resistance. Similarly the N+ bottom gate contact 21 can be closer to the P channel region 22 by lying outside the P+ channel region 28 and on the other side of the deep P channel region 24. This also reduces the series resistance in the bottom gate 20. The conduction voltage of the punch-through diode in FIG. 5 remains the same as that of FIG. 4 because it is set by the voltage needed to form a depletion layer extending from the top gate 32, 30 through the P channel region 22 to the N bottom gate 20, 21.

Figure 6:
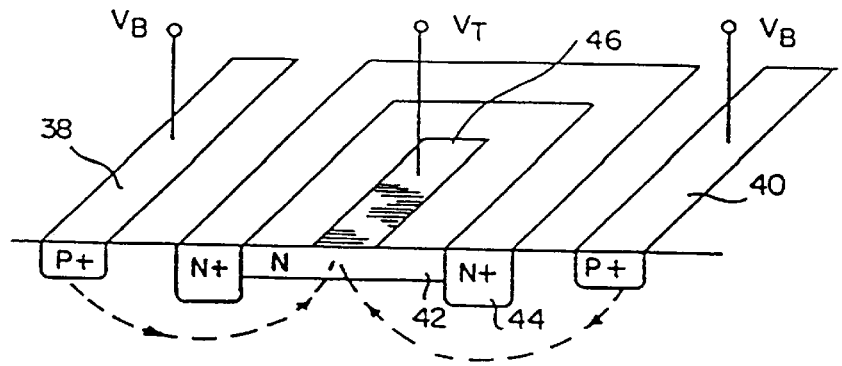
FIG. 6 is a cut-away perspective of a MESFET connected as a punch-through diode according to the principles of the present invention.

Metal Schottky junction field effect transistors (MESFET) may also be used for the punch-through diode. A preferred structure of an isolated gate MESFET is described in U.S. Pat. No. 4,948,746. This structure may be used or an optimized structure for a punch-through diode as illustrated in FIG. 6. The MESFET is an N channel MESFET having a P bottom gate 36 with P+ contacts 38, 40. The N punch-through or channel region 42 includes a thicker N+ region 44. Top gate 46 is a Schottky metal which forms a Schottky junction with the channel 42. When the voltage VB on the bottom gate 36, 38, 40 is greater than the voltage VT on the top gate 46, the channel region portion 42 is depleted and breaks down providing conduction across the channel region 42. As was true in the comparison between FIGS. 4 and 5, the optimization of FIG. 6 deletes the drain region and its contact thereby minimizing the geometry for punch-through diode.

One of the features of these diodes is that they can be made with lower breakdown voltages than available from diffused diodes with avalanche or zener breakdown. Punch-through voltages with less than 4 volts are easily realized and are useful when such voltages are required.

The punch-through diodes can also be made with low noise. Punch-through diodes as those of FIGS. 4 and 5 have been made with one KHz spot noise of approximately 28 $nv/Hz^{1/2}$ and 0.1–10 Hz peak to peak noise of approximately 6.7 microvolts. These are lower values than achieved with buried zener diodes and make these devices attractive as low noise voltage reference devices.

Figure 12:
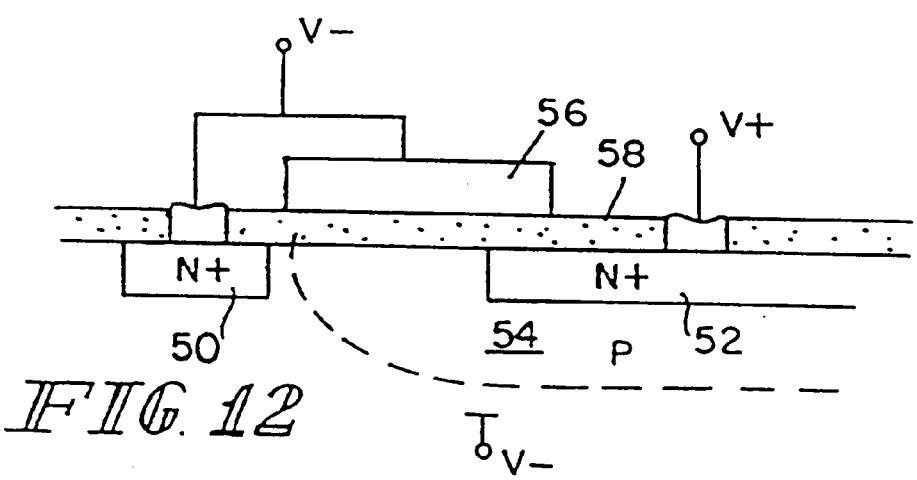
FIG. 12 is cross sectional view of an insulated gate field effect transistor connected to operate as a punch-through diode.

The punch-through diode may also be formed by an insulated gate field effect transistor as illustrated in FIG. 12. N+ source 50 and drain 52 are formed in a P body 54. A gate 56 is separated from the channel between the source 50 and drain 54 by an insulative layer 58. The drain 52 is positively biased with respect to the source 50. The depletion region extends from the drain 52 to the source 50 and punches through. The channel length or the distance between source 50 and drain 52 is selected to be small enough such that the punch-through voltage between the source and drain is lower than the break down voltage between the junction of the drain 52 and the body 54. It should be noted that the normal operation of the insulated gate field effect device of FIG. 12 is that the channel region between source 50 and drain 52 is inverted to form a conduction path therebetween by the gate bias.

Figure 7:
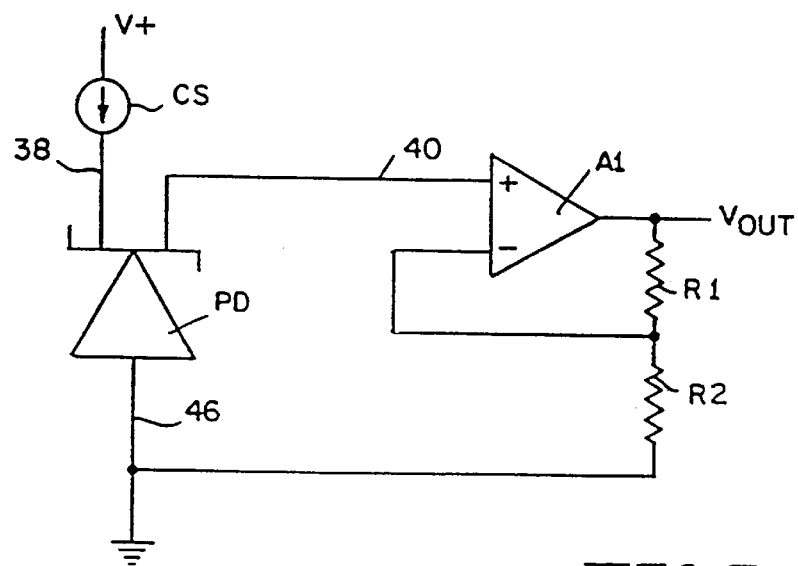
FIG. 7 is a schematic showing a Kelvin connection of a punch-through diode according to FIG. 6.

A high resistance in the terminals of the punch-through diode causes variations in the voltage temperature coefficient due to the temperature coefficient of the voltage drop across these resistances. The Schottky conductor 46 has a low resistance. Thus, the only high resistance is the connection to the bottom gate 36. A Kelvin connection for the pair of contacts region 38 and 40 of the bottom gate is illustrated in the circuit of FIG. 7. A current source CS is connected to terminal 38 while the other terminal 40 is connected to the positive terminal of an operational amplifier A1. The output is connected through a feedback resistors R1, R2 to the negative terminal of amplifier A1 and to ground. The top gate Schottky contact 46 is also connected to ground.

Figure 9:
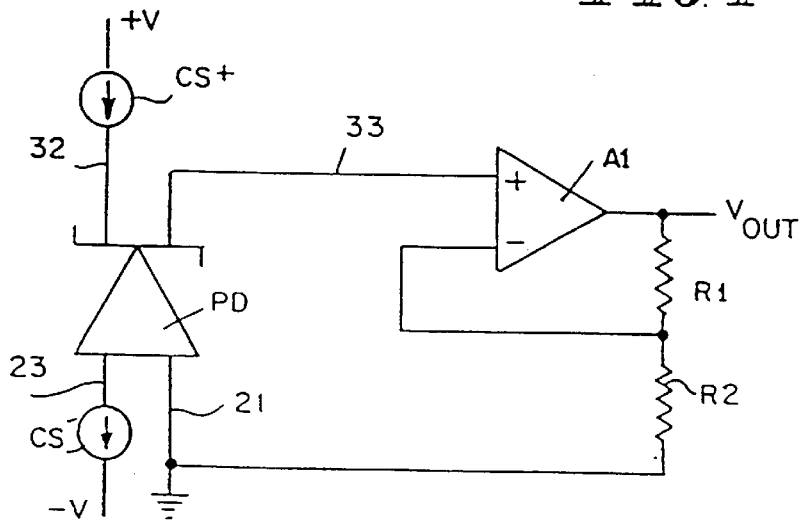
FIG. 9 is a schematic of a Kelvin connection of the punch-through diode of FIG. 8.

For a junction field effect transistor as in FIG. 5, both of the gate contacts have high series resistance. Modification to FIG. 5 is illustrated in FIG. 8 wherein the bottom gate includes N+ contact 21 and an additional N+ contact 23. Also the top gate 30 has N+ contact 32 and a separate N+ contact 33. A second deep P channel region 25 is added to accommodate the N+ contact region 33. The Kelvin contact connection illustrated in FIG. 9 includes a positive current source CS+ connected to the force terminal 32 of the top gate and a negative current source CS− is connected to the bottom gate source terminal 23. The current sources CS+ and CS− are of the same nominal value. The bottom gate sense terminal 21 is grounded while the top gate sense terminal 33 is connected to the positive terminal of amplifier A1. The output of A1 is connected to the negative input of A1 by feedback resistors R1, R2. The only currents which flow in these sense leads 33, 21 and thus develop voltage across their series resistance are the positive input bias current of the amplifier A1 and the mismatch current of the two current sources CS+ and CS−. Both of these currents can be made small, thereby minimizing the parasitic voltage drop terms which appear in the output voltage.

Figure 13:
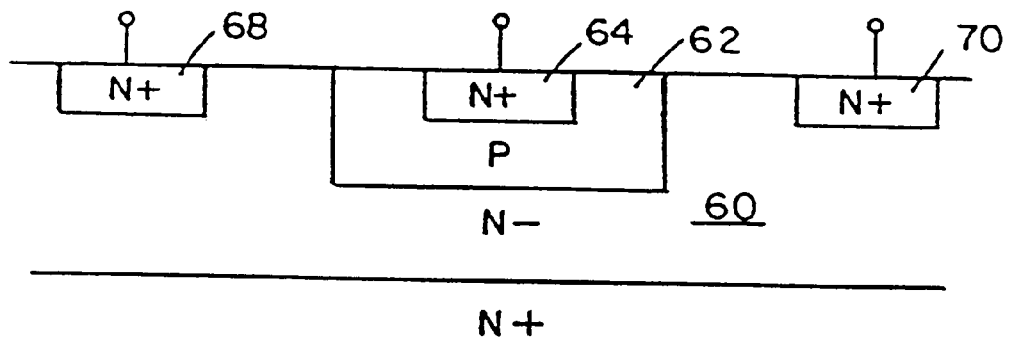
FIG. 13 is a cross section illustrating a bipolar transistor connected as a punch-through diode having Kelvin connections.
Figure 14:
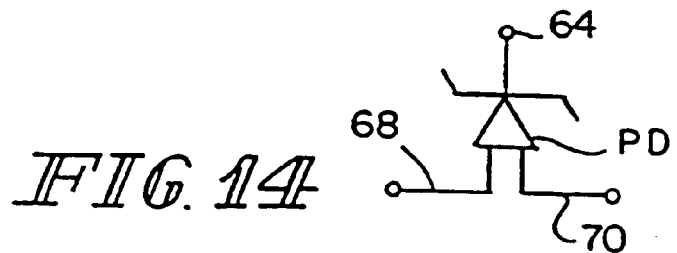
FIG. 14 is a schematic of a Kelvin connection of the punch-through diagram of FIG. 13.

A Kelvin connection can also be provided for a bipolar punch-through diode as illustrated in FIG. 13. An N− collector 60 includes a P base 62 and an N+ emitter 64. A pair of N+ collector contacts 68 and 70 are also provided. As illustrated in FIG. 14, the two collector contacts 68 and 70 provide the force and sense terminals needed for a Kelvin connection, with the output being at the emitter 64. Appropriate connection to a amplifier as in FIGS. 7 and 9 would provide the required Kelvin connections.

A punch-through diode is also an effective voltage element in a clamped or cascode transistor circuit. The cascode circuit configuration consists of two devices connected in series such that the output voltage and its variation occur on the output of a cascode device while the input signal is applied to a cascoded device. Additional devices are used to accomplish the biasing of the cascode device relative to the cascoded device.

The input or cascoded device must have some minimum voltage maintained across it (drain to source for an FET or emitter to collector for a bipolar) to keep it in the normal region of operation. This is the saturated region in which drain current changes little with drain voltage for an FET. The desired region for a bipolar is the normal or unsaturated region of operation in which the collector current changes little with collector voltage. The cascode voltage must be large enough to maintain the desired region of operation while not too large so not to diminish the output voltage variation at the circuit output.

An FET Q3 is illustrated in FIG. 10 as the input or cascoded device having its source connected to the current source $CS^1$. Connected between the source and drain of Q3 is a punch-through diode PD5 illustrated as a FET version. The top gate of PD5 is connected to the source of Q3 by an emitter follower transistor Q4, and the bottom gate of PD5 is connected to the drain of Q3 through output cascode transistor Q5 and connected to current source CS2. The punch-through diode PD5 provides the primary cascode voltage and tracks the FET drain saturation voltage at Vgs=0 over process and temperature because both are set by the gate and channel doping profiles which are common to both the FET Q3 and the punch-through diode PD5.

The drain-source voltage on input device Q3 is fixed independently of input voltage by the cascode circuit. Emitter follower Q4 which is biased by CS2 through the punch-through diode PD5 follows Q3's source voltage. Q4's emitter voltage (VBE below Q3's source voltage) is dropped by a punch-through diode breakdown to the base of Q5. The drain of Q3 is at VBE of Q5 above Q5's base. Thus the drain-source voltage of Q3 is set at VBE (Q4)+BV (PDS)–VBE (Q5). As the input voltage moves up or down, Q3's Vds is held constant by the cascode circuit while the input voltage variations are transferred to the cascode or output device Q5's collector by the cascode circuit.

The voltage maintained across the drain to source of Q3 is approximated by breakdown voltage of PD5 because VBE (Q4) is approximately equal to VBE(PQ5). The breakdown voltage of PD5's is approximately the one gate pinch off voltage of JFET Q3 because PD5 is made with the same process steps as is Q3. PD5's breakdown is the voltage required for a depletion layer to spread from reverse biased top junction through the separating region to the bottom junction just as one gate pinch off voltage is the voltage required for a depletion layer to spread from reverse biased gate to channel junction across the channel to the second gate to channel junction. Thus the punch-through diode provides a cascode voltage which tracks the JFET pinch off voltage over process variations and also over temperature because the process steps and physical mechanisms which determine them are the same.

The maximum saturation voltage for a JFET is approximately its pinch off voltage. The saturations voltage reaches the maximum when Vgs=0; it is smaller for reverse biassed Vgs. Thus the FET based punch-through diode PD5 has a breakdown voltage greater than the saturation voltage of FETQ3 and provides just the minimum cascode voltage needed to keep the FET in the desired saturated region of operation.

Prior art cascoded circuits generally use a number of forward biased diodes in series or a resister. The diodes and resistor do not have the proper temperature coefficient to track the FET Q3 and their voltage does not track the FET drain voltage saturation over process variations.

It is desirable to maintain minimum cascode voltage in cascoded bipolar circuits such as FIG. 11 to allow maximum voltage for signal voltage variation just as it is for FET circuits. The minimum allowable bipolar cascode voltage is set at approximately cascoded bipolar's VBE plus $I_C \times Rcs$ where IC is the bipolar collector current and Rcs is the collector's series resistance. Since Rcs is set by both process and geometry and IC is set by circuit design, the minimum cascode voltage is not as closely related to a single device parameter as is the case for an FET.

A clamped or cascode bipolar transistor circuit is illustrated in FIG. 11. An input or cascoded transistor Q6 is connected in series with output or cascode transistor Q7. A bipolar version of the punch-through diode PD6 is connected to the base of Q7 and current source CS and to the emitter of Q6 by emitter follower Q8.

Although an FET punch-through diode is preferred to track an FET Q3 in FIG. 10 and a bipolar punch-through diode for the bipolar transistor Q6, in FIG. 11, desirous results are also produced by using any of the punch-through diode structures in either of the circuits irrespective for which device it is a voltage reference.

Figure 15:
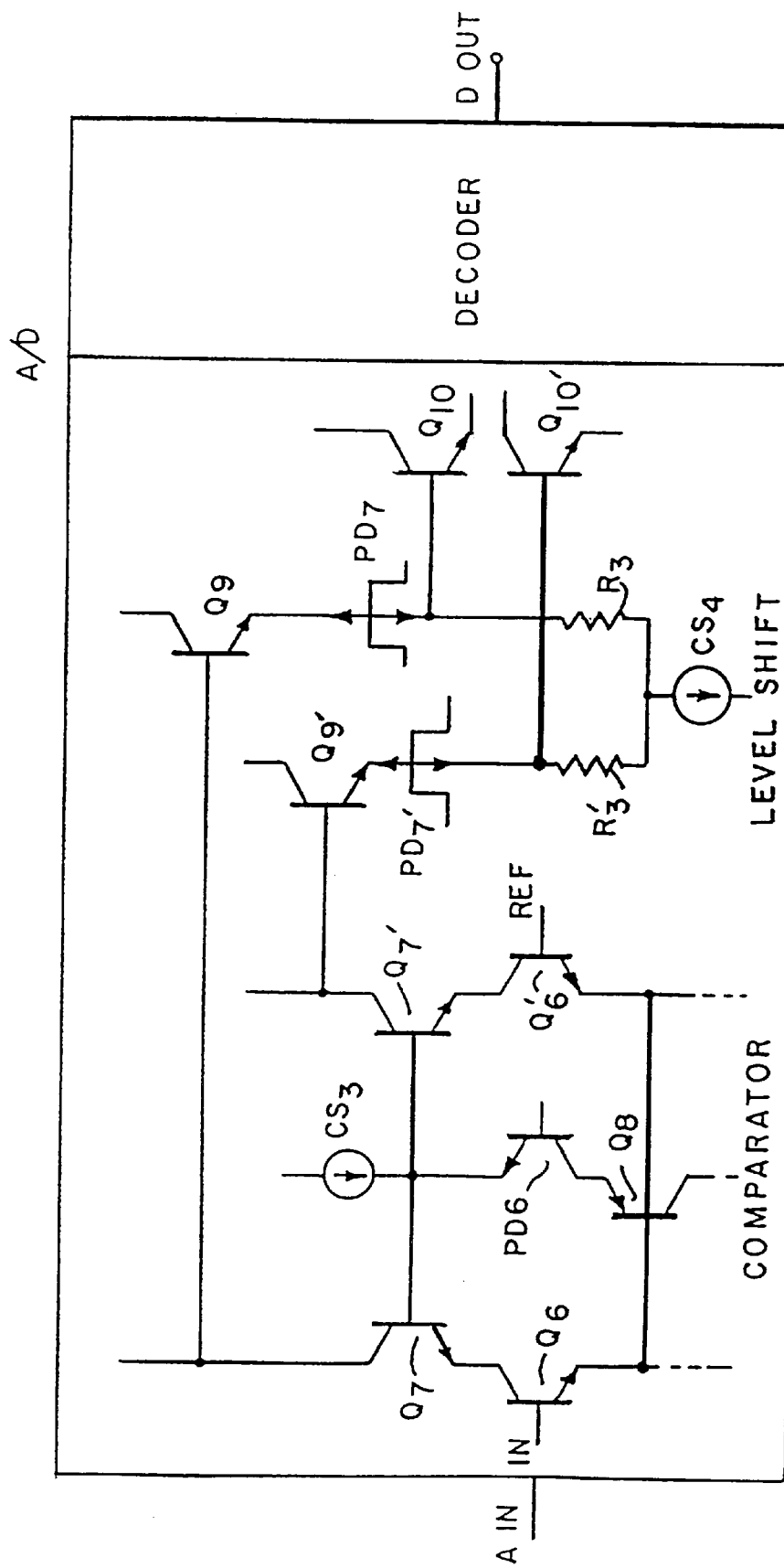
FIG. 15 is a block diagram of an A/D converter incorporating a comparator according the principles of the past invention.

The punch-through diodes of the present invention match well since their breakdown voltage is essentially one gate pinch-off voltage. Use of this match feature together with the low noise is ideal for level shifting of two sides of a differential signal path as is required for example in a comparator. Comparators are used to build many kinds of A/D converters including, flash, two-step flash, and successive approximation A/D converters. A typical bipolar converter would use the FIG. 11 configuration having the common punch-through diode PD6 and follower Q8 connected to two pairs of cascodes transistors Q6/Q7 and Q6'/Q7' for each of the inputs as illustrated in FIG. 15. Similarly, on a multi-stage converter, a punch-through diode PD7 and PD7' would replace the standard diodes in the level shifter between the emitter of the emitter followers Q9, Q9' and resistance R3, R3'. Transistors Q10, Q10' sense the level shifted by the breakdown of the level shifting breakdown diodes PD7, PD7'. Although a differential signal is shown symmetrically level shifted by a matched pair of punch-through diodes, level shifting of a single signal using a single punch-through diode is also possible. A generic description of the comparator in an A/D converter as just described is illustrated in FIG. 15.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. An electronic circuit including a cascoded transistor stage, said stage comprising:

a first transistor having a control terminal, a current path between first and second terminals, and first and second semiconductor layers separated by a third semiconductor layer;

a first punch-through diode connected in parallel circuit with the current path through said first transistor through contact terminals for establishing a second to first terminal voltage;

said punch-through diode including a first semiconductor layer having the same doping and thickness as said first semiconductor layer of said first transistor separated from a second semiconductor layer having the same doping and thickness as said second semiconductor layer of said first transistor by a third semiconductor layer having the same doping and thickness as said third semiconductor layer of said first transistor;

said first and said second semiconductor layers of the diode being connected to said punch-through diode contact terminals.

2. The circuit according to claim 1 wherein bias voltage on the punch-through diode is such that the junction between the first semiconductor layer and the third semiconductor layer of the diode is reverse biased.

3. The circuit according to claim 1 wherein the first semiconductor layer of the first transistor and punch-through diode are formed in the same process steps, and the second semiconductor layer of the first transistor and punch-through diode are formed in the same process steps, and the third semiconductor layer of the first transistor and punch-through diode are formed in the same process steps.

4. The circuit according to claim 1 wherein the punch through voltage of the diode and the first terminal saturation voltage of the first transistor have similar variation with change in doping and thickness of the first, second and third semiconductor layers.

5. The circuit according to claim 1 wherein said diode conducts current between its first and second semiconductor layers when the depletion layer spreading from the reverse biased junction between the first semiconductor layer and the third semiconductor layer reaches the junction between the second semiconductor layer and the third semiconductor layer.

6. The circuit according to claim 1, wherein the first semiconductor layer is N, the second semiconductor layer is N and the third semiconductor layer is P.

7. An electronic circuit according to claim 1 wherein:
said first transistor has an FET structure wherein said first, second and third semiconductor layers are top gate, channel and bottom gate respectively, and first, second and control terminals are drain, source and gate respectively; and
said diode has an FET structure of said first transistor wherein the first semiconductor layer of the diode is connected in circuit with said source of said first transistor and the second semiconductor layer of the diode is connected in circuit with said drain of said first transistor.

8. An electronic circuit according to claim 1 wherein:
said first transistor has a bipolar structure wherein first, second and third semiconductor layers are emitter, collector and base respectively and said first, second and control terminals are collector, emitter and base respectively; and
said diode has a bipolar structure of said first transistor wherein the first semiconductor layer of the diode is connected in circuit with said collector of said first transistor and the second semiconductor layer is connected in circuit with said emitter of said first transistor.

9. An electronic circuit according to claim 1:
including a second transistor having a current path between a first and a second terminal and having a control terminal, said first terminals of said first and second transistors being connected to connect the current paths of said first and second transistors in series;
including a third transistor having a current path between a first and a second terminal and having a control terminal, said first terminal of said third transistor being connected to a first terminal of said diode and said control terminal of said third transistor being connected to said second terminal of said first transistor; and
wherein a second terminal of said diode is connected to said control terminal of said second transistor.

10. An electronic circuit according to claim 9 wherein said second and third transistors are bipolar transistors of opposite conductivity types.

11. An electronic circuit according to claim 1:
including a second transistor having a current path between a first and a second terminal and having a control terminal, said current paths of said first and second transistors are in parallel and form a comparator for comparing signals at said control terminals of said first and second transistors; and
Wherein said punch-through diode being also in a circuit connected between said first and second terminals of said second transistor for establishing a first to second terminal operating voltage which is substantially independent of control terminal voltage relative to said supply voltage of said electronic circuit.

12. An electronic circuit according to claim 11 including a level shifter stage in said electronic circuit, said level shifter having a voltage drop element defining said level shift and said voltage drop element comprising a punch-through diode.

13. An electronic circuit according to claim 12 wherein said level shifter includes a pair of punch-through diodes, each forming a voltage drop element for a respective output of said first and second transistors.

14. An electronic circuit according to claim 11:
including a third transistor having a current path between a first and a second terminal and having a control terminal, said first terminals of said first and third transistors being connected to connect the current paths of said first and third transistors in series;
including a fourth transistor having a current path between a first and a second terminal and having a control terminal, said first terminals of said second and fourth transistors being connected to connect the current paths of said second and fourth transistors in series;
including a fifth transistor having a current path between a first and a second terminal and having a control terminal, said first terminal of said fifth transistor being connected to a first terminal of said diode and said control terminal of said fifth transistor being connected to said second terminal of said first and second transistors; and
wherein a second terminal of said diode is connected to said control terminal of said third and fourth transistors.

15. An electronic circuit according to claim 14 wherein said third, fourth and fifth transistors are bipolar transistors and said third and fourth transistors are of opposite conductivity types to said fifth transistor.

* * * * *